United States Patent [19]
Dodson

[11] Patent Number: 5,638,895
[45] Date of Patent: Jun. 17, 1997

[54] TWIN FAN COOLING DEVICE

[76] Inventor: Douglas A. Dodson, 5995 Avenida Encinas, Carlsbad, Calif. 92008

[21] Appl. No.: 621,448

[22] Filed: Mar. 25, 1996

[51] Int. Cl.$^6$ .............. H05K 7/20; H01L 23/467
[52] U.S. Cl. .............. 165/121; 165/80.3; 361/697
[58] Field of Search .............. 165/80.3, 121, 165/185; 361/697; 174/16.3

[56] References Cited

U.S. PATENT DOCUMENTS

| | | | |
|---|---|---|---|
| 3,592,260 | 7/1971 | Berger | 165/121 |
| 4,027,206 | 5/1977 | Lee | 361/384 |
| 4,158,875 | 6/1979 | Tajima et al. | 361/384 |
| 4,233,644 | 11/1980 | Hwang et al. | 174/16.3 X |
| 4,277,816 | 7/1981 | Dunn et al. | 361/384 |
| 4,399,485 | 8/1983 | Wright et al. | 361/383 |
| 4,513,812 | 4/1985 | Papst et al. | 165/80 B |
| 4,807,441 | 2/1989 | Agee et al. | 62/3 |
| 5,029,236 | 7/1991 | Yasuda et al. | 455/90 |
| 5,277,547 | 1/1994 | Washizu | 415/208.1 |
| 5,309,983 | 5/1994 | Bailey | 165/80.3 |
| 5,341,871 | 8/1994 | Stelzer | 165/121 |
| 5,526,875 | 6/1996 | Lin | 165/80.3 |
| 5,528,454 | 6/1996 | Niklos | 361/695 |

FOREIGN PATENT DOCUMENTS

| | | | |
|---|---|---|---|
| 3-268394 | 11/1991 | Japan | 361/697 |
| 5-206668 | 8/1993 | Japan | 361/697 |

*Primary Examiner*—Allen J. Flanigan
*Attorney, Agent, or Firm*—Calif Tervo

[57] ABSTRACT

A cooling device for an electronic component, such as a computer processor, generally comprises a heat sink and a pair of fans. The fans are redundant in that sufficient cooling is supplied should one fan fail. The fans are independently powered and are inspectable and independently replaceable in situ without un-powering the other fan or the processor. The heat sink includes a base plate having a bottom for surface contact with the processor, a front row of fins projecting upward from the front of the base plate and a rear row of fins projecting upward from the rear of the base plate. Right and left fans are mounted substantially within a cavity between fan rows. Each fan blows a flow of air such that the flow impinges on the base plate. A central channel between the front and rear fin rows provides a path for air impinging on the left side of the heat sink to flow to the right side, should the right fan fail, and for air impinging on the right side of the heat sink to flow to the left side, should the left fan fail.

20 Claims, 2 Drawing Sheets

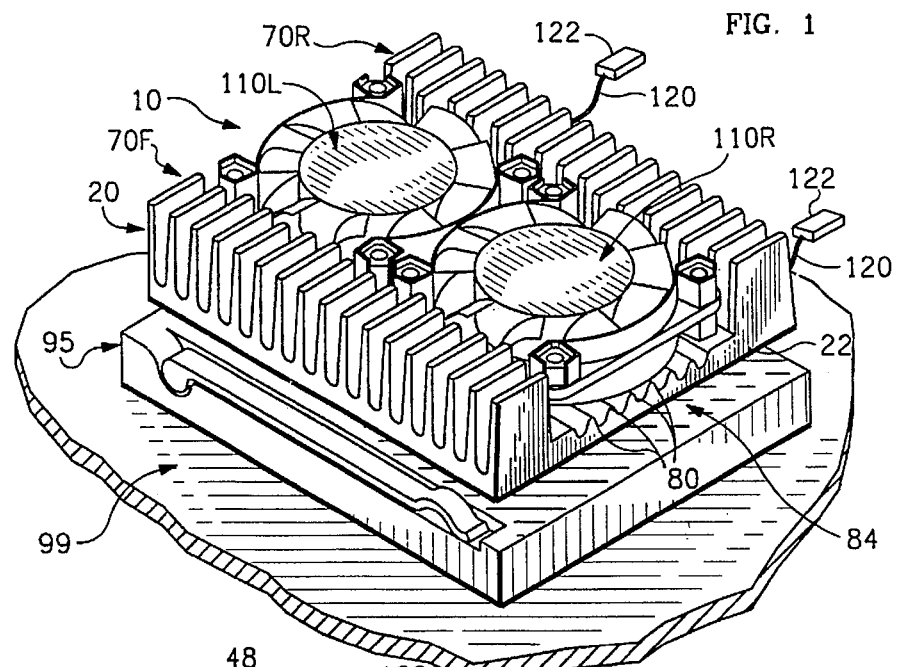
FIG. 1
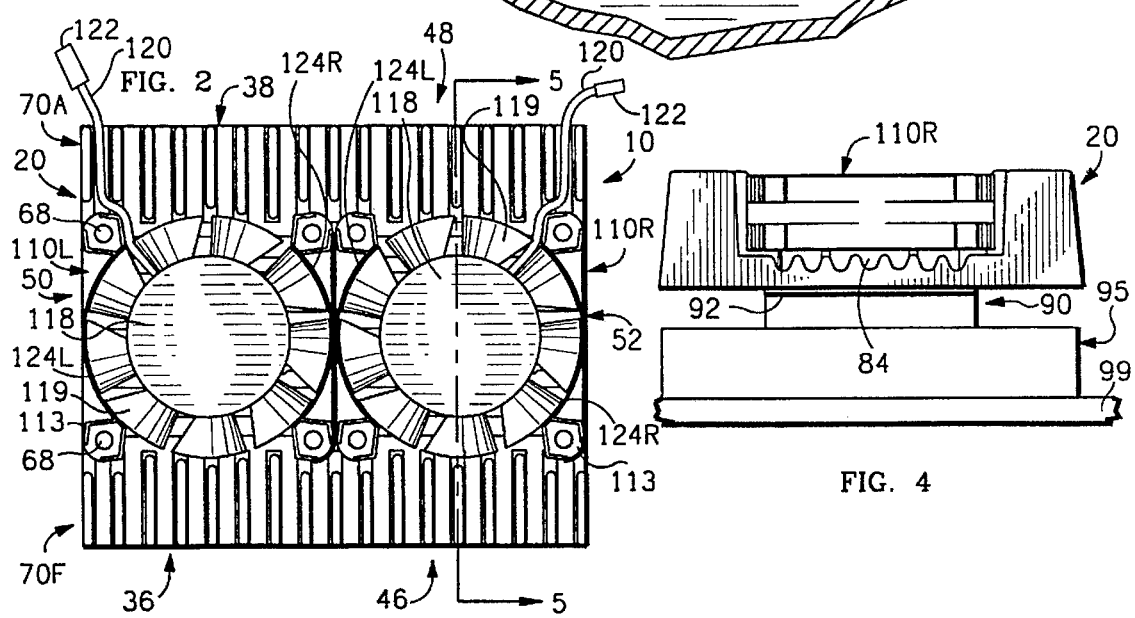
FIG. 2
FIG. 4
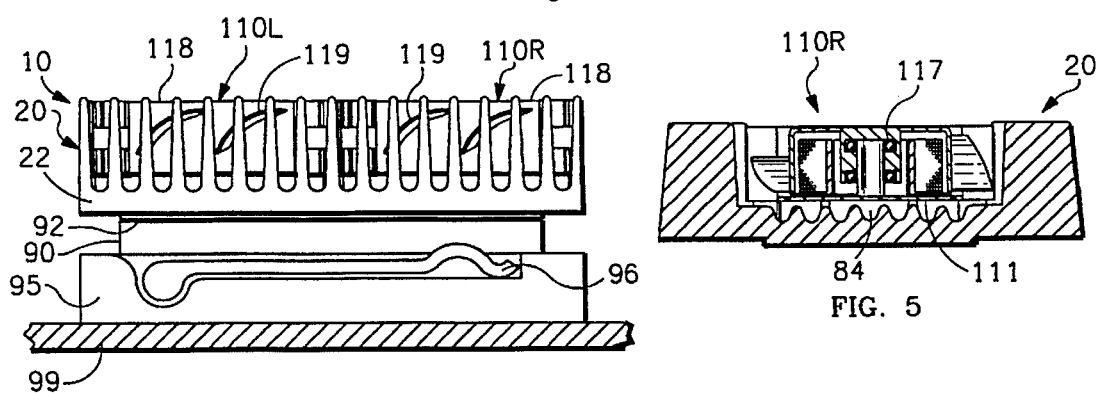
FIG. 3
FIG. 5

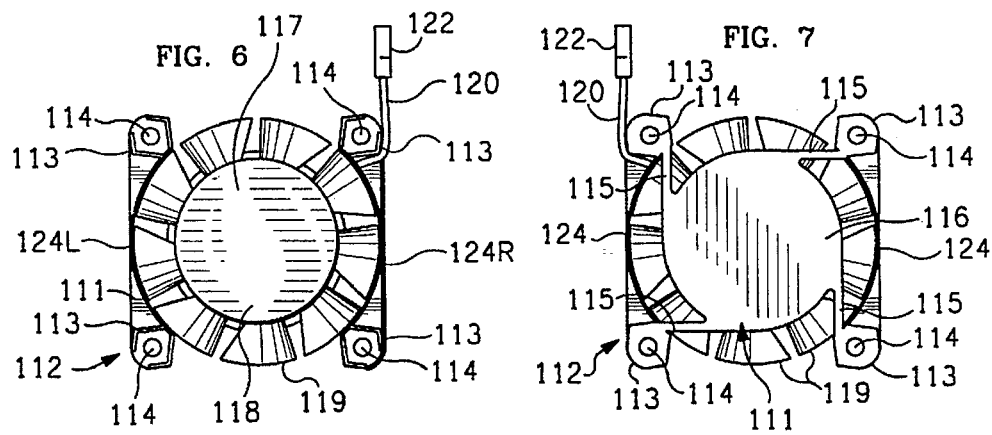
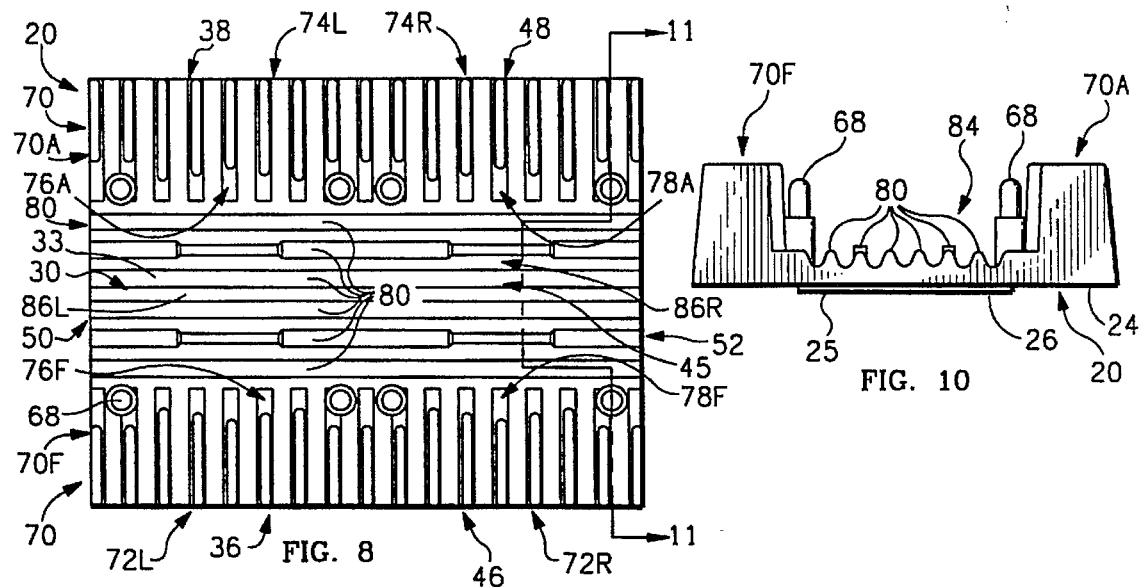
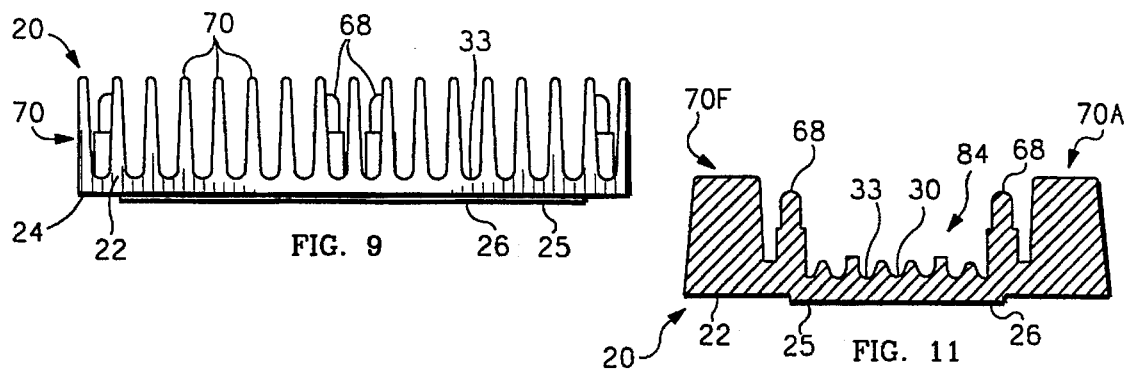

TWIN FAN COOLING DEVICE

BACKGROUND OF THE INVENTION

1. Field of the Invention

This invention relates in general to a cooling device for an electronic component and more specifically to a integrated heat sink and fans for cooling a semiconductor device such as a computer processor.

2. Background of the Invention

Many current electronic components, such as computer processors, such as Intel's Pentium Pro processor, generate significant heat internally during operation which must be dissipated or the processor will fail or otherwise malfunction. There are several constrains on such cooling devices. Since it is desirable that the printed circuit board containing the processor plug into a conventional backplane and not occupy space reserved for other boards, the size of the cooling unit is limited. also, it is difficult to achieve a plentiful flow of air between the boards to adequately dissipate heat from the heat sink. Consequently, small heat sinks including an attached fan have been developed for attachment to processors.

However, there are still two major problems associated with the current art. First, fans are electro-mechanical devices that are subject to a failure rate significantly higher than pure electronic components. Since the cooling capacity of the heat sink is dependent upon the operation of the fan, failure of the fan results in failure of the processor. Second, some processors not only malfunction upon temperature buildup but are damaged. In these instances, failure of a fan results in the computer going down and the costly replacement of the processor. Third, many modern applications require that the processor be operating at all times. Should the computer go down, the application being performed will be irretrievably damaged resulting in considerable time and money loss.

Thus, it is desirable to have an improved cooling device for a processor such that the cooling device has a longer mean time between failures.

It is further desirable that the improved cooling device includes redundant components that, while the device is operation in situ, are easily inspectable for failure and independently replaceable such that the processor need never malfunction, fail or be damaged due to failure of the cooling device.

SUMMARY OF THE INVENTION

According to the invention, a cooling device for an electronic component, such as a computer processor, generally comprises a heat sink and a pair of fans. The heat sink includes a base plate having a bottom for surface contact with the processor, a front row of fins projecting upward from the front of the base plate and a rear row of fins projecting upward from the rear of the base plate. Front row fins and rear row fins have a front to rear orientation. The inner ends of the front fins are spaced from inner ends of the rear so as to define a cavity therebetween. Right and left fans are mounted substantially within the cavity. Each fan blows a flow of air such that the flow impinges on the base plate. The maximum external dimensions of the heat sink define a box or envelope and, preferably, the fans are contained within the envelope. A central channel between front and rear fin rows provides a path for air impinging on the left side of the heat sink to flow to the right side, should the right fan fail and for air impinging on the right side of the heat sink to flow to the left side, should the left fan fail. Channel fins within the central channel project upward from the base plate and have a left-right orientation.

The fans are redundant in that sufficient cooling is supplied should one fan fail. The fans are independently powered in that failure of one fan does not result in failure of the other. The fans are inspectable in situ. A failed fan may be independently replaced in situ without un-powering the other fan or the processor. Alternately, should a fan fail, the entire cooling device may be quickly removed and replaced with the electronic device in situ without un-powering the processor, i.e. a "hotswap".

Other features and many attendant advantages of the invention will become more apparent upon a reading of the following detailed description together with the drawings in which like reference numerals refer to like parts throughout.

BRIEF DESCRIPTION OF THE DRAWINGS

FIG. 1 is a perspective view of a preferred embodiment of the cooling device of the invention mounted on an electronic component (not seen) that is in a socket on a printed circuit board.

FIG. 2 is a top plan view of the cooling device of FIG. 1.

FIG. 3 is a front elevation view of the cooling device and electronic component, socket and printed circuit board of FIG. 1.

FIG. 4 is an end elevation view of the cooling device of FIG. 1.

FIG. 5 is a sectional view taken on line 5—5 of FIG. 2.

FIG. 6 is a top plan view of a fan of FIG. 1.

FIG. 7 is a bottom plan view of the fan of FIG. 6.

FIG. 8 is a top plan view of the heat sink portion of the cooling device of FIG. 1.

FIG. 9 is a front elevation view thereof, the rear view being a mirror image.

FIG. 10 is a right end elevation view thereof, the left end being a mirror image.

FIG. 11 is a sectional view thereof taken on line 11—11 of FIG. 8.

DETAILED DESCRIPTION OF THE INVENTION

With reference now to the drawings, and more specifically to FIGS. 1, 3 and 4 thereof, there is shown in FIG. 1 a perspective view of a preferred embodiment of the cooling device, generally denoted as 10, of the invention and, in FIG. 3 a front elevation view and in FIG. 4 an end elevation view, of cooling device 10 and typical environment including electronic component 90, socket 95 and printed circuit board 99.

Cooling device 10 is mounted upon an electronic component, such as a semiconductor component, such as processor 90 that is sensitive to heat. Processor 90 is plugged into socket 95. Lever 96 is manipulated to clamp processor 90 into socket 95 and make electrical connections between socket 95 to processor 90. Socket 95 is attached to printed circuit board 99, shown partially cut away. Although a socket 95 is commonly used to mount processor 90, a socket 95 is not necessary for the functioning of the invention. The top surface 92 of processor 90 emits heat. Top surface 92 is generally flat and rectangular.

Cooling device 10 generally comprises a heat sink, denoted generally as 20, and a plurality of fans 110, such as left fan 110L and right fan 110R.

FIGS. 5, 6 and 7 best show fans 110. The general nature of the fans 110 of the invention are well-known. In the preferred embodiment, each fan 110 generates an air flow of about three cubic feet per minute. Left fan 110L and right fan 110R may be identical. FIG. 5 is a sectional view taken on line 5—5 of FIG. 2 showing a fan 110 in cross-section. FIG. 6 is a top plan view of a fan 110 of FIG. 1. FIG. 7 is a bottom plan view of the fan 110 of FIG. 6.

Fans 110 generally include a housing 111 and a motor 117. Housing 111 includes mounting means, denoted generally as 112, including mounts 113 including bores 114, braces 115 attached to mounts 113 and a central platform 116 supported by braces 115. Electrical motor 117, supported on central platform 116, includes a rotor 118 having peripheral blades 119. Fans 110 are individually electrically powered by a power cord 120 including an electrical connector 122 for connection to a power source, such as a power supply, not shown. Thus, each fan 110 operates independently of the operation of the other fan 110. Rotor 117 rotates about a vertical axis such that blades 119 rotate in a horizontal plane and generate a flow of air that is pulled downward and impinges on heat sink 20. Air is also forced out of the sides of fan 110. The path of the tips of the blades define a fan circumference. Each fan 110 may include a partial shroud 124, such as left shroud 124L and right shroud 124R, attached to fan housing 111. Left and right shrouds 124L, 124R are disposed immediately adjacent the fan circumference and block air from exiting blades 119 directly horizontally to the left or right such that air exiting left or right is first forced downward to impinge on heat sink 20. It can be seen that shrouds 124 need not be part of fan 110 and could be part of heat sink 20, that is could be similar to a cooling fin except with a slot beneath for air passage.

FIGS. 8–11 best show the construction of a preferred embodiment of heat sink 20. FIG. 8 is a top plan view of the heat sink portion 20 of cooling device 10 of FIG. 1. FIG. 9 is a front elevation view thereof. FIG. 10 is a end elevation view thereof. FIG. 11 is a sectional view thereof taken on line 11—11 of FIG. 8.

Heat sink 20 may be constructed out of any suitable material having a high coefficient of thermal conductivity, such as aluminum or copper or their alloys, as is well-known in the art.

Heat sink 20 generally comprises a base plate 22 and a number of heat-dissipating fins 70. Base plate 22 includes a bottom 24 and a top 30. Bottom 24 of base plate 22 includes a contact surface 26 adapted for substantial surface contact with the heat-emitting surface 92 of electronic component 90. In the preferred embodiment shown, contact surface 26 is on a thickened portion 25 of base plate 22 such that the remainder of bottom 24 is separated a distance from the component 90 and socket 95 thereby allowing some heat dissipation from bottom 24. Heat sink 20 is attached to component 90 by any means well-known in the art which may include gluing or using a resilient retainer. Either attachment method may utilize a thermal compound between top surface 92 of component 90 and contact surface 26 of heat sink 20 that aids in heat transfer.

Top 30 of base plate 22 includes a generally planar surface 33, a left side 35 including a front 36 and a rear 38, a right side 45 including a front 46 and a rear 48, a left end 50 and a right end 52. Mounting means, such as fan mounting posts 68, project upward from surface 33 and are adapted for receiving and retaining fan mounting bores 114 such that fans 110 are held in place.

Fins 70 generally project upward from top 30 of base plate 22 and are thin and elongated. Fins 70 include a front row 70F of fins 70, a rear row 70A of fins 70 and lateral fins 80.

Front fin row 70F comprises a plurality of left front fins 72L and a plurality of right front fins 72R. Left front fins 72L project upward from front 36 of left side 35 of top 30. Each left front fin 72L is oriented generally front to rear and separated by a space from adjacent left front fins 72L so as to allow air flow between them. Each right front fin 72R projects upward from front 46 of right side 45 of top 30 and are oriented generally front to rear and separated by a space from adjacent right front fins 72R so as to allow air flow between them.

Rear fin row 70A comprises a plurality of left rear fins 74L and a plurality of right rear fins 74R. Left rear fins 74L project upward from rear 38 of left side 35 of top 30. Each left rear fin 74L is oriented generally rear to rear and separated by a space from adjacent left rear fins 74L so as to allow air flow between them. Each right rear fin 72R project upward from rear 48 of right side 45 of top 30 and are oriented generally front to rear and separated by a space from adjacent right rear fins 74R so as to allow air flow between them.

The inner ends 76F of front left fins 72L are separated from inner ends 76A of rear left fins 74A so as to define a left cavity 86L therebetween. Preferably, left fan 110L is disposed substantially within left cavity 86L, preferably, such that air can flow under left fan 110L.

The inner ends 78F of front right fins 72R are separated from inner ends 78A of rear right fins 74R so as to define a right cavity 86R therebetween. Preferably, right fan 110R is disposed substantially within right cavity 86R, preferably, such that air can flow under right fan 110R.

As best seen in FIGS. 3 and 4, the maximum external dimensions of heat sink 20 define a box or envelope and fans 110L, 110R are contained within the envelope. Basically, all of the space in the envelope is occupied by fans 110 and fins 70 and the spaces between fins.

The bottoms of cavities 86L, 86R are connected by a central channel 84 such that air may flow laterally between the bottoms of the cavities 86L, 86R. Central channel 84 provides a path for air impinging on left side 35 of top 30 to flow to right side 45 and for air impinging on right side 45 to flow to left side 35. In the preferred embodiment, central channel 84 extends laterally the entire top 30 of heat sink 20 and left cavity 86L and right cavity 86R are joined.

A plurality of channel or lateral fins 80 within central channel 84 project upward from planar surface 33 and have a left-right orientation. Lateral fins 80 dissipate heat to air flowing in channel 84 and especially aid in heat dissipation should one fan fail.

Left fan 110L is mounted to heat sink 20 above left side 35 of top 30. Left fan 110L is operable for generating a flow of air such that the flow impinges on left side 35 of top 30 including on central channel 84 and exits top 30 to left end 50, between left front fins 72L to front 36 of left side 35 and between left rear fins 74L to rear 38 of left side 35. Should right fan 110R fail, left fan 110L is still operable for generating a flow of air such that the flow of air impinges on left side 36 of top 30 including on central channel 84 and flows via central channel 84 to right side 45 of top 30 and exits top 30 to left end 50, between left front fins 72L to front 36 of left side 35, between left rear fins 74L to rear 38 of left side 35, between right front fins 72R to front 46 of right side 45, between right rear fins 74R to rear 48 of right side 45 and to right end 52 such that processor 90 is sufficiently cooled.

Right fan 110R is mounted to heat sink 20 above right side 45 of top 30. Right fan 110R is operable for generating a flow of air such that the flow impinges on right side of top 30 including on central channel 84 and exits top 30 to right end 52, between right front fins 72R to front 46 of right side 45 and between right rear fins 74R to rear 48 of right side 45, and, should left fan 110L fail, right fan 110R is still operable for generating a flow of air such that the flow of air impinges on right side 45 of top 30 including on central channel 84 and flows via central channel 84 to left side 35 of top 30 and exits top 30 to right end 52, between right front fins 72R to front 46 of right side 45, between right rear fins 74R to rear 48 of right side 45, between left front fins 72L to front 36 of left side 35, between left rear fins 74L to rear 38 of left side 35 and to left end 50 such that processor 90 is sufficiently cooled.

A cooling device 10 according to the above description was used to cool an Intel Pentium© Pro Processor. The device 10 was made of aluminum and has a base plate thickness of 0.185 inches and channel fin height of 0.100 inches. Both fans blew air at a rate of three cubic feet per minute. The ambient air was 25 degrees Celsius. With both fans operating, the processor was maintained at 40 degrees Celsius. With one fan failure, the processor was maintained at 45 degrees Celsius; well within the processor's specifications.

From the above, it can be seen that processor 90 can remain in continuous operation even with failure of a fan 110. Moreover, it should be further appreciated that fans 110L, 110R are mounted on top of cooling device 10 such that can be seen for easy inspection in position in a computer and such that, if either fan should fail, the failed fan can be replaced in situ in the computer without disturbing the other fan. Alternatively, upon discovery of a failed fan, the entire cooling device may be quickly removed and replaced with the electronic device in situ without un-powering the processor, i.e. a "hot-swap". As a result of the invention, processor 90 should never malfunction as a result of fan failure.

Although a particular embodiment of the invention has been illustrated and described, various changes may be made in the form, composition, construction, and arrangement of the parts without sacrificing any of its advantages. Therefore, it is to be understood that all matter herein is to be interpreted as illustrative and not in any limiting sense, and it is intended to cover in the appended claims such modifications as come within the true spirit and scope of the invention.

I claim:

1. A cooling device for an electronic component having a heat-emitting surface; said cooling device comprising:
   a heat sink including:
      a base plate including:
         a bottom including:
            a surface adapted for substantial surface contact with the heat-emitting surface the electronic component;
         a top including:
            a generally planar surface;
            a left side including:
               a front; and
               a rear;
            a right side including:
               a front; and
               a rear;
            a left end; and
            a right end; and
         left and right fans;
   said left fan mounted to said heat sink above said left side of said top; said left fan being operable for generating a flow of air such that the flow impinges on said left side of said top; should said right fan fail, said left fan still being operable for generating a flow of air such that the flow of air impinges on said left side of said top;
   said right fan mounted to said heat sink above said right side of said top; said right fan being operable for generating a flow of air such that the flow impinges on said right side of said top; should said left fan fail, said right fan still being operable for generating a flow of air such that the flow of air impinges on said right side of said top.

2. The cooling device of claim 1, said heat sink further including:
   a central channel means between said left side of said top and said right side of said top for providing a path for air impinging on said left side of said top to flow to said right side of said top and for air impinging on said right side of said top to flow to said left side of said top such that, should said right fan fail, said left fan still being operable for generating a flow of air such that the flow of air impinges on said left side of said top and flows via said central channel means to said right side of said top and such that, should said left fan fail, said right fan still being operable for generating a flow of air such that the flow of air impinges on said right side of said top and flows via said central channel means to said left side of said top.

3. The cooling device of claim 2:
   said top including:
      a plurality of channel fins within said central channel means, projecting upward from said planar surface and having a left right orientation.

4. A cooling device for an electronic component having a heat-emitting surface; said cooling device comprising:
   a heat sink including:
      a base plate including:
         a bottom including:
            a surface adapted for substantial surface contact with the heat-emitting surface the electronic component;
         a top including:
            a generally planar surface;
            a left side including:
               a front; and
               a rear;
            a right side including:
               a front; and
               a rear;
            a left end; and
            a right end; and
         left and right fans;
   said left fan mounted to said heat sink above said left side of said top; said left fan being operable for generating a flow of air such that the flow impinges on said left side of said top and exits said top to said front of said left side and to said rear of said left side; should said right fan fail, said left fan still being operable for generating a flow of air such that the flow of air impinges on said left side of said top and flows to said right side of said top and exits said top to said front of said left side, to said rear of said left side, to said front of said right side and to said rear of said right side;
   said right fan mounted to said heat sink above said right side of said top; said right fan being operable for generating a flow of air such that the flow impinges on said right side of said top and exits said top to said front of said right side and to said rear of said right side; should said left fan fail, said right fan still being operable for generating a flow of air such that the flow of air impinges on said right side of said top and flows to said left side of said top and exits said top to said front of said right side, to said rear of said right side, to said front of said left side and to said rear of said left side.

5. The cooling device of claim 4, said heat sink further including:
   a front fin row comprising:
      a plurality of left front fins; each said left front fin projecting upward from said front of said left side of said top; each said left front fin oriented generally front to rear and separated by a space from adjacent said left front fins; and
      a plurality of right front fins; each said right front fin projecting upward from said front of said right side of said top; each said right front fin oriented generally front to rear and separated by a space from adjacent said right front fins; and
   a rear fin row comprising:
      a plurality of left rear fins; each said left rear fin projecting upward from said rear of said left side of said top; each said left rear fin oriented generally front to rear and separated by a space from adjacent said left rear fins; and
      a plurality of right rear fins; each said right rear fin projecting upward from said rear of said right side of said top; each said right rear fin oriented generally front to rear and separated by a space from adjacent said right rear fins;
      said fins defining a central channel means between said fin rows for providing a path for air impinging on said left side of said top to flow to said right side of said top and for air impinging on said right side of said top to flow to said left side of said top; and
   the air flow from said left fan impinges on said left side of said top including said central channel means and exits said top between said left front fins to said front of said left side and between said left rear fins to said rear of said left side; should said right fan fail, said left fan still being operable for generating a flow of air such that the flow of air impinges on said left side of said top and flows via said central channel means to said right side of said top and exits said top between said left front fins to said front of said left side, between said left rear fins to said rear of said left side, between said right front fins to said front of said right side and between said right rear fins to said rear of said right side;
   the air flow from said right fan impinges on said right side of said top and exits said top between said right front fins to said front of said right side and between said right rear fins to said rear of said right side; should said left fan fail, said right fan still being operable for generating a flow of air such that the flow of air impinges on said right side of said top and flows via said central channel means to said left side of said top and exits said top between said right front fins to said front of said right side, between said right rear fins to said rear of said right side, between said left front fins to said front of said left side and between said left rear fins to said rear of said left side.

6. The cooling device of claim 5:
   said top including:
      a plurality of channel fins within said central channel means, projecting upward from said planar surface and having a left right orientation.

7. The cooling device of claim 5:
   said fins having inner ends;
      said inner ends of said left front fins being separated from said inner ends of said left rear fins so as to define a left cavity therebetween;
   said left fan being disposed substantially within said left cavity;
   said inner ends of said right front fins being separated from said inner ends of said right rear fins so as to define a right cavity therebetween; and
   said right fan being disposed substantially within said right cavity.

8. The cooling device of claim 7:
   each said fan having a blade rotating in a horizontal plane about a vertical axis; each said blade having a tip path defining a circumference.

9. The cooling device of claim 8:
   said fin inner ends conforming to the circumference of said fan blades.

10. A cooling device for an electronic component having a heat-emitting surface; said cooling device comprising:
   a heat sink including:
      a base plate including:
         a bottom including:
            a surface adapted for substantial surface contact with the heat-emitting surface the electronic component;
         a top including:
            a generally planar surface;
            a left side;
            a right side;
            a front including:
               a left side; and
               a right side; and
            a rear including:
               a left side; and
               a right side;
      a front fin row comprising:
         a plurality of left front fins; each said left front fin projecting upward from said front left side of said top; each said left front fin oriented generally front to rear and separated by a space from adjacent said left front fins;
         a plurality of right front fins; each said right front fin projecting upward from said front right side of said top; each said right front fin oriented generally front to rear and separated by a space from adjacent said right front fins;
      a rear fin row comprising:
         a plurality of left rear fins; each said left rear fin projecting upward from said rear left side of said top; each said left rear fin oriented generally front to rear and separated by a space from adjacent said left rear fins;
         a plurality of right rear fins; each said right rear fin projecting upward from said rear right side of said top; each said right rear fin oriented generally front to rear and separated by a space from adjacent said right rear fins; there being a separation between said fin rows; and
      left and right fans;
   said left fan mounted to said heat sink above said separation of said left side of said top; said left fan being operable for generating a flow of air such that the flow impinges on said left side of said top and exits said top between said left front fins to said front left side and between said left rear fins to said rear left side; should said right fan fail, said left fan still being operable for generating a flow of air such that the flow of air impinges on said left side of said top and flows over said right side of said top and exits said top between said left front fins to said front left side, between said left rear fins to said rear left side, between said right front fins to said front right side and between said right rear fins to said rear right side;

said right fan mounted to said heat sink above said separation of said right side of said top; said right fan being operable for generating a flow of air such that the flow impinges on said right side of said top and exits said top between said right front fins to said front right side and between said right rear fins to said rear right side; should said right fan fail, said left fan still being operable for generating a flow of air such that the flow of air impinges on said right side of said top and flows over said left side of said top and exits said top between said right front fins to said front right side, between said right rear fins to said rear right side, between said left front fins to said front left side and between said left rear fins to said rear left side.

11. The cooling device of claim 10:
said top including:
a plurality of channel fins within said central channel means, projecting upward from said top and having a left right orientation.

12. The cooling device of claim 10:
said fins having inner ends;
said inner ends of said left front fins being separated from said inner ends of said left rear fins so as to define a left cavity therebetween;
said left fan being disposed substantially within said left cavity;
said inner ends of said right front fins being separated from said inner ends of said right rear fins so as to define a right cavity therebetween; and
said right fan being disposed substantially within said right cavity.

13. The cooling device of claim 12:
each said fan having a blade rotating in a horizontal plane about a vertical axis; each said blade having a tip path defining a circumference.

14. The cooling device of claim 13:
said fin inner ends conforming to the circumference of said fan blades.

15. A cooling device for an electronic component having a heat-emitting surface; said cooling device comprising:
a heat sink including:
a base plate including:
a bottom including:
a surface adapted for substantial surface contact with the heat-emitting surface the electronic component;
a top including:
a generally planar surface including:
a left side including:
a front; and
a rear;
a right side including:
a front; and
a rear;
a left end; and
a right end;
a front fin row comprising:
a plurality of left front fins; each said left front fin projecting upward from said front of said left side of said top; each said left front fin oriented generally front to rear and separated by a space from adjacent said left front fins;
a plurality of right front fins; each said right front fin projecting upward from said front of said right side of said top; each said right front fin oriented generally front to rear and separated by a space from adjacent said right front fins;
a rear fin row comprising:
a plurality of left rear fins; each said left rear fin projecting upward from said rear of said left side of said top; each said left rear fin oriented generally front to rear and separated by a space from adjacent said left rear fins;
a plurality of right rear fins; each said right rear fin projecting upward from said rear of said right side of said top; each said right rear fin oriented generally front to rear and separated by a space from adjacent said right rear fins;
said fins defining a central channel means between said fin rows for providing a path for air impinging on said left side of said top to flow to said right side of said top and for air impinging on said right side of said top to flow to said left side of said top; and
left and right fans;
said left fan mounted to said heat sink above said left side of said top; said left fan being operable for generating a flow of air such that the flow impinges on said left side of said top including said central channel means and exits said top to said left end, between said left front fins to said front of said left side and between said left rear fins to said rear of said left side; should said right fan fail, said left fan still being operable for generating a flow of air such that the flow of air impinges on said left side of said top and flows via said central channel means to said right side of said top and exits said top to said left end, between said left front fins to said front of said left side, between said left rear fins to said rear of said left side, between said right front fins to said front of said right side, between said right rear fins to said rear of said right side and to said right end;
said right fan mounted to said heat sink above said right side of said top; said right fan being operable for generating a flow of air such that the flow impinges on said right side of said top and exits said top to said right end, between said right front fins to said front of said right side and between said right rear fins to said rear of said right side; should said left fan fail, said right fan still being operable for generating a flow of air such that the flow of air impinges on said right side of said top and flows via said central channel means to said left side of said top and exits said top to said right end, between said right front fins to said front of said right side, between said right rear fins to said rear of said right side, between said left front fins to said front of said left side, between said left rear fins to said rear of said left side and to said left end.

16. The cooling device of claim 15:
said front fins and said rear fins having inner ends;
said inner ends of said left front fins being separated from said inner ends of said left rear fins so as to define a left cavity therebetween;

said left fan being disposed substantially within said left cavity;

said inner ends of said right front fins being separated from said inner ends of said right rear fins so as to define a right cavity therebetween; and said right fan being disposed substantially within said right cavity.

17. The cooling device of claim 15 wherein:

said top includes:

a plurality of channel fins within said central channel means, projecting upward from said planar surface and having a left-right orientation.

18. The cooling device of claim 16 wherein:

said top includes:

a plurality of channel fins within said central channel means, projecting upward from said planar surface and having a left-right orientation.

19. The cooling device of claim 16:

each said fan having a blade rotating in a horizontal plane about a vertical axis; each said blade having a tip path defining a circumference.

20. The cooling device of claim 19:

said front and rear fin inner ends conforming to the circumference of said fan blades.

* * * * *